United States Patent
Kano

(10) Patent No.: US 6,175,123 B1
(45) Date of Patent: *Jan. 16, 2001

(54) SEMICONDUCTOR DEVICES WITH QUANTUM-WAVE INTERFERENCE LAYERS

(75) Inventor: Hiroyuki Kano, Aichi-ken (JP)

(73) Assignee: Canare Electric Co., Ltd., Aichi-gun (JP)

(*) Notice: Under 35 U.S.C. 154(b), the term of this patent shall be extended for 0 days.

This patent is subject to a terminal disclaimer.

(21) Appl. No.: 09/059,374

(22) Filed: Apr. 14, 1998

(30) Foreign Application Priority Data

Apr. 25, 1997 (JP) .................................... 9-123481

(51) Int. Cl.[7] .................................... H01L 29/15
(52) U.S. Cl. .................................... 257/9; 257/13; 257/17; 257/20; 257/21; 257/97; 257/184; 257/192; 257/461
(58) Field of Search .................................... 257/9, 12–15, 257/17, 19, 20, 21, 24, 79, 94, 96, 97, 183, 184, 186, 187, 192, 199, 200, 201, 431, 438, 461, 613–616

(56) References Cited

U.S. PATENT DOCUMENTS

| | | |
|---|---|---|
| 5,091,756 | 2/1992 | Iga et al. . |
| 5,544,187 | 8/1996 | Kadoiwa et al. . |
| 5,737,350 | * 4/1998 | Motoda et al. .................... 372/45 |

FOREIGN PATENT DOCUMENTS

| | | |
|---|---|---|
| 0 485 237 | 5/1992 | (EP) . |
| 0 569 258 | 11/1993 | (EP) . |
| 0 702 439 | 3/1996 | (EP) . |

OTHER PUBLICATIONS

T. Takagi, et al., Jpn. J. Appl. Phys., vol. 31, Part 1, No. 2A, pp. 197–200, "Electron Wave Reflection by Multiquantum Barrier", Feb., 1992.

C–T. Lee, et al., Appl. Phys. Lett., vol. 67, No. 14, pp. 2046–2048, "Sidegating Effect Improvement of GaAs Metal–Semiconductor Field Effect Transistor by Multiquantum Barrier Structure", Oct. 2, 1995.

Z. Chen, et al., SPIE, vol. 3182, pp. 51–58, Novel Photovoltaic and Bicolor GaAs/AlGaAs Quantum Well Infrared Detector, 1997.

(List continued on next page.)

* cited by examiner

Primary Examiner—Jerome Jackson, Jr.
Assistant Examiner—Bradley W. Baumeister
(74) Attorney, Agent, or Firm—Oblon, Spivak, McClelland, Maier & Neustadt, P.C.

(57) ABSTRACT

A semiconductor device is constituted by a quantum-wave interference layer with plural periods of a pair of a first layer W and a second layer B. The second layer B has wider band gap than the first layer W. Each thickness of the first layer W and the second layer B is determined by multiplying by an odd number one fourth of wavelength of quantum-wave of carriers in each of the first layer W and the second layer B existing around the lowest energy level of the second layer B. A δ layer, for sharply varying energy band, is formed at an every interface between the first layer W and the second layer B and has a thickness substantially thinner than the first layer W and the second layer B. The quantum-wave interference layer functions as a reflecting layer of carriers for higher reflectivity.

15 Claims, 12 Drawing Sheets

OTHER PUBLICATIONS

Akihiko Kikuchi, et al., Faculty of Science and Technology Sophia University, ED91–3, pp. 15 to 21, "Design of AlGaInP Multi–Quantum–Barrier" (with English Abstract).

Takagi et al., "Potential Barrier Height Analysis of AlGaInP Multi–Quantum Barrier (MQB)" Japanese Journal of Applied Physics, vol. 29, No. 11, Nov., 1990, pp. L 1977–L1980.

Takagi et al. "Design of Multi–Quantum Barrier (MQB) and Experimental Verification of MQB Effect" research materials of The Institute of Electronics, Information and Communication Engineers, Optical Quantum Electronics 1991–13, p73–78.

Takagi et al., Tokyo Institute of Technology, OQE91–13, pp. 73–78, Design of Multi–Quantum Barrier (MQB) and Experimental Verification of MQB Effect. (with English Translation), 1991.*

F I G. 4
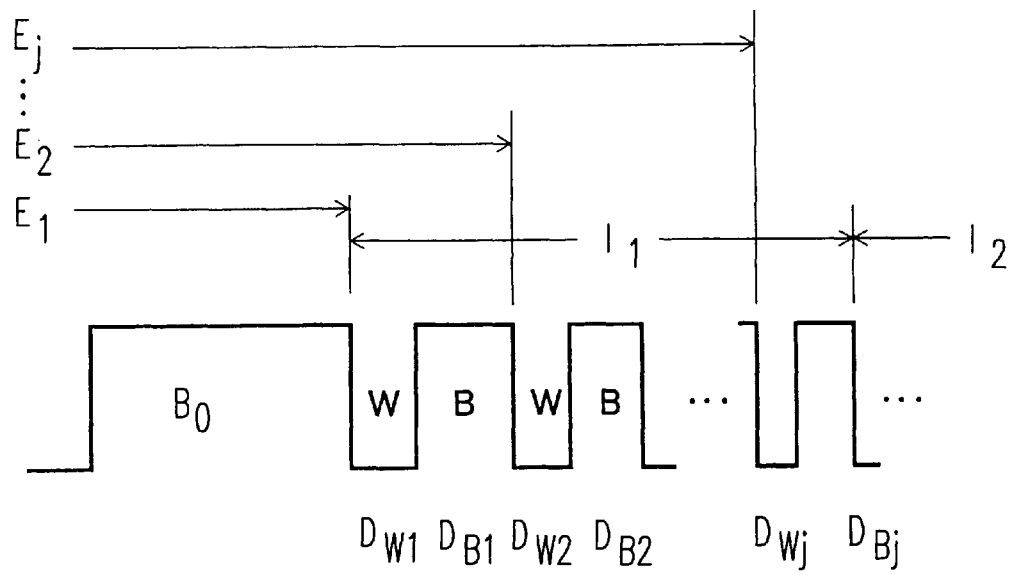
F I G. 5
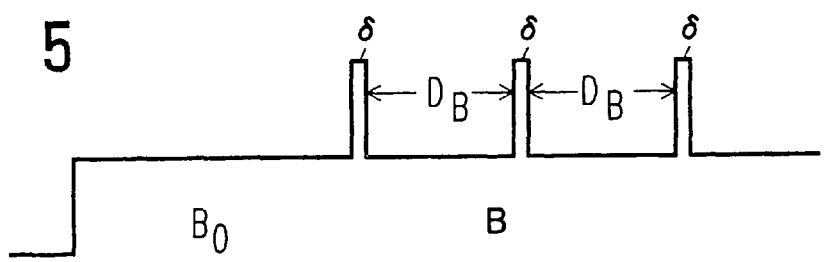
F I G. 6
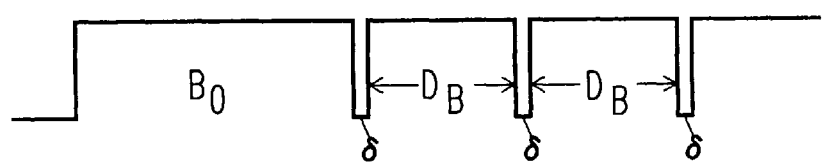
F I G. 7
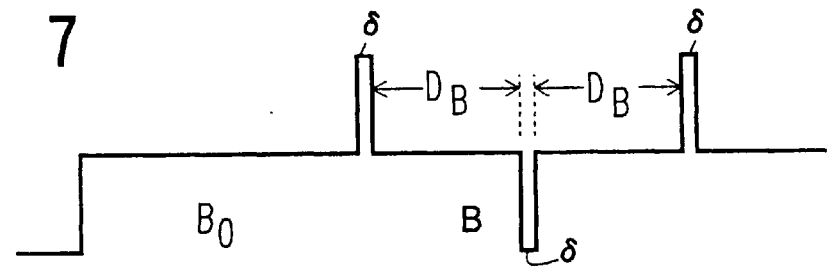

F I G. 1 2 A
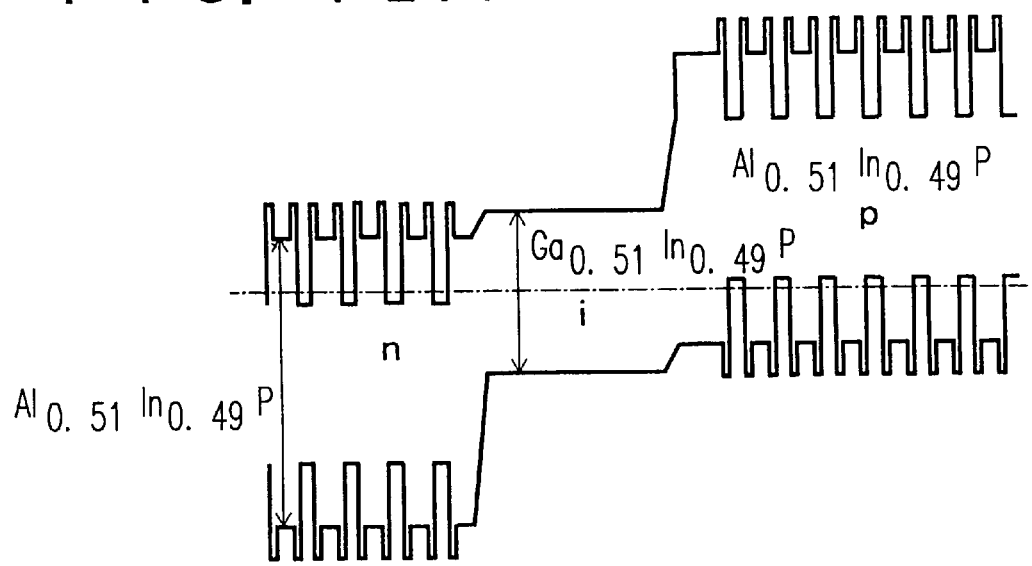
F I G. 1 2 B
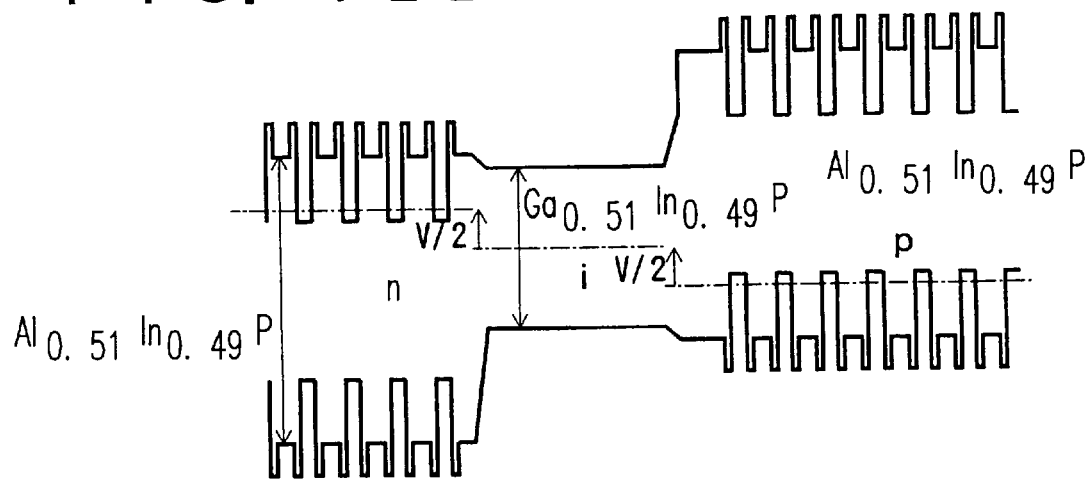

SEMICONDUCTOR DEVICES WITH QUANTUM-WAVE INTERFERENCE LAYERS

BACKGROUND OF THE INVENTION

1. Field of the Invention

The present invention relates to a device having quantum-wave interference layers that reflect carriers, or electrons and holes, effectively. In particular, the invention relates to light-emitting semiconductor devices including a laser (LD) and a light-emitting diode (LED) with improved luminous efficiency by effectively confining carriers within an active layer. Further, the present invention relates to semiconductor devices including a field effect transistor (FET) and a solar cell with improved carrier reflectivity.

2. Description of the Related Art

An LD has been known to have a double hetero junction structure whose active layer is formed between n-type and p-type cladding layers. The cladding layers function as potential barriers for effectively confining carriers, or electrons and holes, within the active layer.

However, a problem persists in luminous efficiency. Carriers overflow the potential barriers of the cladding layers, which lowers luminous efficiency. Therefore, further improvement has been required, as presently appreciated by the present inventors.

As a countermeasure, forming cladding layers with a multi-quantum well structure of a first and a second layers as a unit has been suggested by Takagi et al. (Japanese Journal of Applied Physics. Vol. 29, No. 11, November 1990, pp. L1977–L1980). This reference, however, does not teach or suggest values of kinetic energy of carriers to be considered and the degree of luminous intensity improvement is inadequate.

SUMMARY OF THE INVENTION

The inventors of the present invention conducted a series of experiments and found that the suggested thicknesses of the first and the second layers by Takagi et al. were too small to confine electrons, and that preferable thicknesses of the first and second layers are 4 to 6 times larger than those suggested by Takagi et al. Further, the present inventors thought that multiple quantum-wave reflection of carriers might occur by a multi-layer structure with different band width, like multiple light reflection by a dielectric multi-film structure. And the inventors thought that it would be possible to confine carriers by the reflection of the quantum-wave. As a result, the inventors invented a preferable quantum-wave interference layer and applications of the same.

It is, therefore, a first object of the present invention to provide a quantum-wave interference layer, with high reflectivity to carriers, functioning as a reflecting layer. It is a second object of the present invention to improve quantum-wave reflectivity by additionally providing a new layer structure with a multi-layer structure whose band width is different with respect to each other. It is a third object of the invention to provide variations of a quantum-wave interference layer for effectively reflecting quantum-waves.

In light of these objects a first aspect of the present invention is a semiconductor device constituted by a quantum-wave interference layer having plural periods of a pair of a first layer and a second layer, the second layer having a wider band gap than the first layer. Each thickness of the first and the second layers is determined by multiplying by an odd number one fourth of a quantum-wave wavelength of carriers in each of the first and the second layers existing around the lowest energy level of the second layer.

The second aspect of the present invention is a semiconductor device constituted by a quantum-wave interference layer having plural periods of a first layer and a second layer as a unit. The second layer has a wider band gap than the first layer. A δ layer is included for sharply varying an energy band and is formed between the first and the second layers. Each thickness of the first and the second layers is determined by multiplying by odd number one fourth of quantum-wave wavelength of carriers in each of the first and the second layers, and a thickness of the δ layer is substantially thinner than that of the first and the second layers.

The third aspect of the present invention is to define each thickness of the first and the second layers as follows:

$$D_W = n_W \lambda_W/4 = n_W h/4[2m_W(E+V)]^{1/2} \quad (1)$$

and $$D_B = n_B \lambda_B/4 = n_B h/4(2m_B E)^{1/2} \quad (2)$$

In Eqs. 1 and 2, h, $m_W$, $m_B$, E, V, and $n_W$, $n_B$ represent a plank constant, effective mass of carrier in the first layer, effective mass of carrier in the second layer, kinetic energy of carriers at the lowest energy level around the second layer, potential energy of the second layer to the first layer, and odd numbers, respectively.

The fourth aspect of the present invention is a semiconductor device having a plurality of partial quantum-wave interference layers $I_k$ with arbitrary periods $T_k$ including a first layer having a thickness of $D_{Wk}$ and a second layer having a thickness of $D_{Bk}$ and arranged in series. The thicknesses of the first and the second layers satisfy the formulas:

$$D_{Wk} = n_{Wk} \lambda_{Wk}/4 = n_{Wk} h/4[2m_{Wk}(E_k+V)]^{1/2} \quad (3)$$

and $$D_{Bk} = n_{Bk} \lambda_{Bk}/4 = n_{Bk} h/4(2m_{Bk} E_k)^{1/2} \quad (4).$$

In Eqs. 3 and 4, $E_k$, $m_{Wk}$, $m_{Bk}$, and $n_{Wk}$ and $n_{Bk}$ represent plural kinetic energy levels of carriers flowing into the second layer, effective mass of carriers with kinetic energy $E_k+V$ in the first layer, effective mass of carriers with kinetic energy $E_k$ in the second layer, and arbitrary odd numbers, respectively.

The plurality of the partial quantum-wave interference layers $I_k$ are arranged in series from $I_1$ to $I_j$, where j is a maximum number of k required to form a quantum-wave interference layer as a whole.

The fifth aspect of the present invention is a semiconductor device having a quantum-wave interference layer with a plurality of partial quantum-wave interference layers arranged in series with arbitrary periods. Each of the plurality of partial quantum-wave interference layers is constructed with serial pairs of the first and second layers. The widths of the first and second layers of the serial pairs are represented by $(D_{W1}, D_{B1}), \ldots, (D_{Wk}, D_{Bk}), \ldots, (D_{Wj}, D_{Bj})$. $(D_{Wk}, D_{Bk})$ is a pair of widths of the first and second layers and is defined as Eqs 3 and 4, respectively.

The sixth aspect of the present invention is to form a δ layer between a first layer and a second layer, which sharply varies the energy band and has a thickness substantially thinner than that of the first and second layers.

The seventh aspect of the present invention is a semiconductor device having a quantum-wave interference layer constituted by a plurality of semiconductor layers made of a hetero-material with different band gaps. The interference layer is constituted by a plurality of δ layers for sharply varying the energy band and being formed at an interval of one forth of a quantum-wave wavelength of carriers multiplied by an odd number. The thickness of the δ layers is significantly thinner than the width of the interval.

When a single level E of kinetic energy is adopted, the interval $D_B$ between the δ layers is calculated by Eq. 2. When plural levels $E_k$ of kinetic energy are adopted, the interval $D_{Bk}$ between the δ layers are calculated by Eq. 4. In the latter case, several partial quantum-wave interference layers $I_k$ with the δ layers formed at an interval $D_{Bk}$ in $T_k$ periods may be arranged in series from $I_1$ to $I_j$ to form a quantum-wave interference layer as a whole. Alternatively, the partial quantum-wave interference layer may be formed by serial S layers with intervals of $D_{B1}, \ldots, D_{Bk}, \ldots,$ to $D_{Bj}$, and the plurality of the partial quantum-wave interference layers may be arranged in series with an arbitrary period.

The eighth aspect of the present invention is to use the quantum-wave interference layer as a reflecting layer for reflecting carriers.

The ninth aspect of the present invention is to constitute a quantum-wave incident facet in the quantum-wave interference layer by a second layer with enough thickness for preventing conduction of carriers by a tunneling effect.

The tenth aspect of the present invention is a light-emitting semiconductor device constituted by an n-type layer, a p-type layer, and an active layer that is formed between the n-type layer and the p-type layer, and wherein one of the n-type layer and the p-type layer is the quantum-wave interference layer described in one of the first to ninth aspects of the present invention.

The eleventh aspect of the present invention is a light-emitting semiconductor device with a hetero-junction structure whose active layer is formed between an n-type conduction layer and a p-type conduction layer and one of the n-type and p-type conduction layers is the quantum-wave interference layer described in one of the first to tenth aspects of the present invention. The n-type and p-type conduction layers respectively function as an n-type cladding layer and a p-type cladding layer and carriers are confined into the active layer by being reflected by the quantum-wave interference layer.

The twelfth aspect of the present invention is a field effect transistor including the quantum-wave interference layer, described in one of the first to ninth aspects of the present invention, positioned adjacent to a channel.

The thirteenth aspect of the present invention is a photovoltaic device having a pn junction structure including an n-layer and a p-layer. At least one of the n-layer and p-layer is made of a quantum-wave interference layer described in one of the first to ninth aspects of the present invention for reflecting minor carriers as a reflecting layer.
(first and third aspects of the invention)

The principle of the quantum-wave interference layer of the present invention is explained hereinafter. FIG. 1 shows a conduction band of a multi-layer structure with plural periods of a first layer W and a second layer B as a unit. A band gap of the second layer B is wider than that of the first layer W. Electrons conduct from left to right as shown by an arrow in FIG. 1. Among the electrons, those that exist around the bottom of the second layer B are likely to contribute to conduction. The electrons around the bottom of the second layer B has a kinetic energy E. Accordingly, the electrons in the first layer W have a kinetic energy E+V which is accelerated by potential energy V due to the band gap between the first layer W and the second layer B. In other words, electrons that move from the first layer W to the second layer B are decelerated by potential energy V and return to the original kinetic energy E in the second layer B. As explained above, kinetic energy of electrons in the conduction band is modulated by potential energy due to the multi-layer structure.

When thicknesses of the first layer W and the second layer B are equal to order of quantum-wave wavelength, electrons tend to have characteristics of a wave. The wave length of the electron quantum-wave is calculated by Eqs. 1 and 2 using kinetic energy of the electron. Further, defining the respective wave number vector of first layer W and second layer B as $K_W$ and $K_B$, reflectivity R of the wave is calculated by:

$$R=(|K_W|-|K_B|)/(|K_W|+|K_B|)$$

$$=([m_W(E+V)]^{1/2}-[m_B E]^{1/2})/([m_W(E+V)]^{1/2}+[m_B E]^{1/2})$$

$$=[1-(m_B E/m_W(E+V))^{1/2}]/[1+(m_B E/m_W(E+V))^{1/2}] \tag{5}$$

Further, when $m_B = m_W$, the reflectivity R is calculated by:

$$R=[1-(E/(E+V))^{1/2}]/[1+(E/(E+V))^{1/2}] \tag{6}$$

When $E/(E+V)=x$, Eq. 6 is transformed into:

$$R=(1-x^{1/2})/(1+x^{1/2}) \tag{7}$$

The characteristic of the reflectivity R with respect to energy ratio x obtained by Eq. 7 is shown in FIG. 2.

When the second layer B and the first layer W have S periods, the reflectivity $R_S$ on the incident facet of a quantum-wave is calculated by:

$$R_S=[(1-x^S)/(1+x^S)]^2 \tag{8}$$

When the formula $x \leq 1/10$ is satisfied, $R_S \geq 0.52$. Accordingly, the relation between E and V is satisfied with:

$$E \leq V/9 \tag{9}$$

Since the kinetic energy E of conducting electrons in the second layer B exists around the bottom of the conduction band, the relation of Eq. 9 is satisfied and the reflectivity R at the interface between the second layer B and the first layer W becomes 52% or more. Consequently, the multi-layer structure having two kinds of layers with different band gaps to each other enables effective quantum-wave reflection.

Further, utilizing the energy ratio x enables the thickness ratio $D_B/D_W$ of the second layer B to the first layer W to be obtained by:

$$D_B/D_W=[m_W/(m_B x)]^{1/2} \tag{10}$$

Thicknesses of the first layer W and the second layer B are determined for selectively reflecting one of holes and electrons, because of a difference in potential energy between the valence and the conduction bands, and a difference in effective mass of holes and electrons in the first layer W and the second layer B. Namely, the optimum thickness for reflecting electrons is not optimum for reflecting holes. Eqs. 5–10 refer to a structure of the quantum-wave interference layer for reflecting electrons selectively. The thickness for selectively reflecting electrons is designed based on a difference in potential energy of the conduction band and effective mass of electrons. Further, the thickness for selectively reflecting holes is designed based on a difference in potential energy of the valence band and effective mass of holes, realizing another type of quantum-wave interference layer for reflecting only holes and allowing electrons to pass through.

(fourth aspect of the invention)

As shown in FIG. 3, a plurality of partial quantum-wave interference layers $I_k$ may be formed corresponding to each of a plurality of kinetic energy levels $E_k$. Each of the partial quantum-wave interference layers $I_k$ has $T_k$ periods of a first layer W and a second layer B as a unit whose respective thicknesses ($D_{Wk}$, $D_{Bk}$) are determined by Eqs. 3 and 4. The plurality of the partial quantum-wave interference layer $I_k$ is arranged in series with respect to the number k of kinetic energy levels $E_k$. That is, the quantum-wave interference layer is formed by a serial connection of $I_1$, $I_2$, . . . , and $I^j$. As shown in FIG. 3, electrons with each of the kinetic energy levels $E_k$ are reflected by the corresponding partial quantum-wave interference layers $I_k$. Accordingly, electrons belonging to each of the kinetic energy levels from $E_1$ to $E_j$ are reflected effectively. By designing the intervals between the kinetic energies to be short, thicknesses of the first layer W and the second layer B ($D_{Wk}$, $D_{Bk}$) in each of the partial quantum-wave interference layers $I_k$ vary continuously with respect to the value k.

(fifth aspect of the invention)

As shown in FIG. 4, a plurality of partial quantum-wave interference layers may be formed with an arbitrary period. Each of the partial quantum-wave interference layers, $I_1$, $I_2$, . . . is made of serial pairs of the first layer W and the second layer B with widths ($D_{Wk}$, $D_{Bk}$) determined by Eqs 3 and 4. That is, the partial quantum-wave interference layer, e.g., $I_1$, is constructed with serial layers of width ($D_{W1}$, $D_{B1}$), ($D_{W2}$, $D_{B2}$), . . . , ($D_{Wj}$, $D_{Bj}$), as shown. A plurality $I_1$, $I_2$, . . . of layers such as layer $I_1$ are connected in series to form the total quantum-wave interference layer. Accordingly, electrons of the plurality of kinetic energy levels $E_k$ are reflected by each pair of layers in each partial quantum-wave interference layers. By designing the intervals between kinetic energies to be short, thicknesses of the pair of the first layer W and the second layer B ($D_{Wk}$, $D_{Bk}$) in a certain partial quantum-wave interference layer varies continuously with respect to the value k.

(second and sixth aspects of the invention)

The second and sixth aspects of the present invention are directed to forming a δ layer at the interface between the first layer W and the second layer B. The δ layer has a relatively thinner thickness than both of the first layer W and the second layer B and sharply varies an energy band. Reflectivity R of the interface is determined by Eq. 7. By forming the δ layer, the potential energy V of an energy band becomes larger and the value x of Eq. 7 becomes smaller. Accordingly, the reflectivity R becomes larger.

Variations are shown in FIGS. 8A to 8C. The δ layer may be formed on both ends of the every first layer W as shown in FIGS. 8A to 8C. In FIG. 8A, the δ layers are formed so that an energy level higher than that of the second layer B may be formed. In FIG. 8B, the δ layers are formed so that an energy level lower than that of the first layer W may be formed. In FIG. 8C, the δ layers are formed so that the energy level higher than that of the second layer B and the energy level lower than that of the first layer W may be formed. As an alternative to each of the variations shown in FIGS. 8A to 8C, the δ layer can be formed on one end of the every first layer W.

Forming one δ layer realizes large quantum-wave reflectivity at the interface between the first layer W and the second layer B and a plurality of the δ layers realizes a larger reflectivity as a whole.

(seventh aspect of the invention)

The seventh aspect of the present invention is to form a plurality of δ layers in second layer B at an interval $D_B$ determined by Eq. 2. Variations are shown in FIGS. 5 to 7. In FIG. 5, the δ layer is formed so that an energy level higher than that of the second layer B may be formed. In FIG. 6, the δ layer is formed so that an energy level lower than that of the second layer B may be formed. In FIG. 7, the δ is formed alternately so that the higher and lower energy levels than the second layer B may be formed.

When a plurality of energy levels of electrons are set, the interval $D_B$ between the δ layers in the second layer B corresponds to thicknesses $D_{Bk}$ of the second layer B in FIGS. 3 and 4. Accordingly, a quantum-wave interference layer can be made from a serial connection of a number j of partial quantum-wave interference layers $I_k$ as shown in FIG. 3. In this case, δ layers are disposed at an interval $D_{Bk}$ with period $T_k$ in each partial interference layers and the number j corresponds to the kinetic energy of electrons. Alternatively, the δ layers may be arranged at an interval from $D_{B1}$ to $D_{Bj}$ in series and may be formed in the second layer B so as to make the partial quantum-wave interference layers and the plurality of the partial quantum-wave interference layers, arranged in series as shown in FIG. 4.

(eighth aspect of the invention)

The eighth aspect of the present invention is directed to a quantum-wave interference layer that functions as a reflecting layer and selectively confines carriers in an adjacent layer. As mentioned above, the quantum-wave interference layer can be designed to confine either electrons or holes selectively.

(ninth aspect of the invention)

The ninth aspect of the present invention, or forming a thick second layer $B_0$ at the side of an incident plane of the quantum-wave interference layer, and effectively prevents conduction by tunneling effects and reflects carriers.

(tenth and eleventh aspects of the invention)

According to the tenth and eleventh aspects of the present invention, the quantum-wave interference layer is formed in at least one of the p-type layer and an n-type layer sandwiching an active layer of a light-emitting semiconductor device and effectively realizes confinement of carriers in the active layer and increases output power.

(twelfth aspect of the invention)

According to the twelfth aspect of the present invention, a quantum-wave interference layer is formed adjacent to a channel of a field effect transistor realizes effective confinement of carriers therein which conduct through the channel so as to improve an amplification factor of the transistor and signal-to-noise (S/N) ratio.

(thirteenth aspect of the invention)

According to the thirteenth aspect of the present invention, a quantum-wave interference layer is formed in a photovoltaic device with a pn junction structure and reflects minor carriers to the p-type or n-type layer and prevents drift of the carriers to a reverse direction around the junction, improving opto-electric conversion efficiency.

BRIEF DESCRIPTION OF THE DRAWING

Other objects, features, and characteristics of the present invention will become apparent upon consideration of the following description and the appended claims with reference to the accompanying drawings, all of which form a part of the specification, and wherein reference numerals designate corresponding parts in the various in the various figures, wherein:

FIG. 4 is an explanatory view of partial quantum-wave interference layers $I_k$ according to the fifth aspect of the present invention;

FIGS. 5–7 are explanatory views of δ layers according to the seventh aspect of the present invention;

FIGS. 12A and 12B are views showing energy diagrams of the light-emitting device in Example 2;

DETAILED DESCRIPTION OF THE PREFERRED EMBODIMENT

The invention will be more fully understood by reference to the following examples.

EXAMPLE 1

Figure 1:
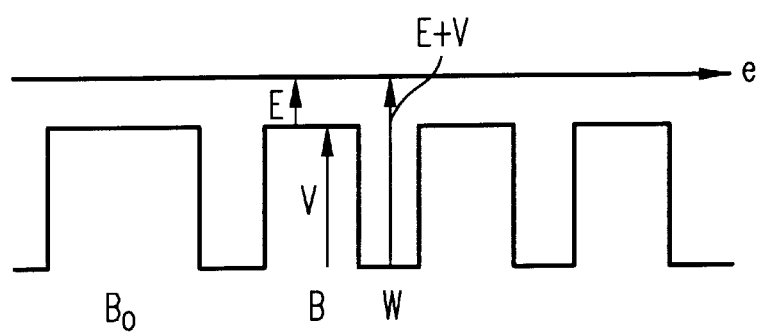
FIG. 1 is an explanatory view of a conduction band of a multi-layer structure according to first and third aspects of the present invention.
Figure 2:
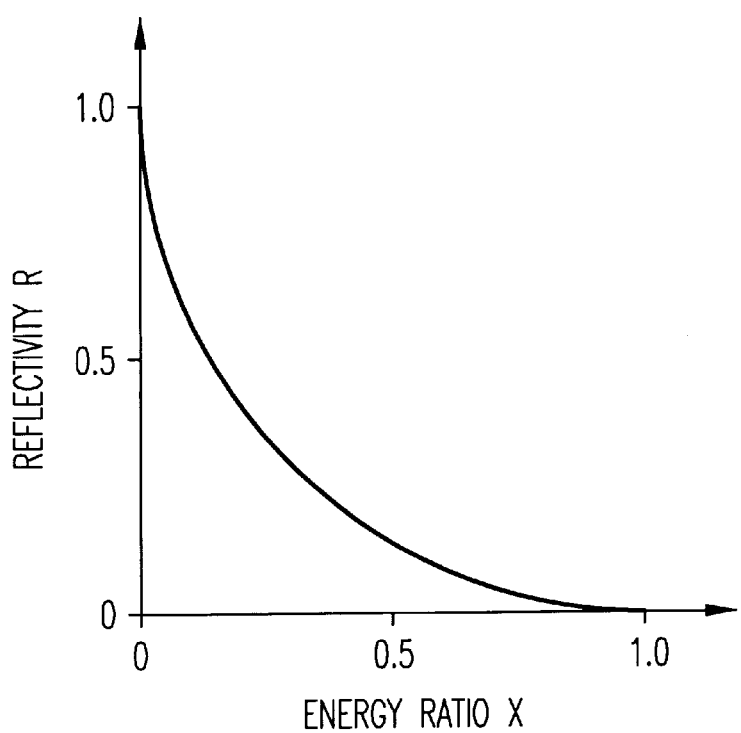
FIG. 2 is a graph showing a relation between an energy ratio x and a reflectivity R.
Figure 3:
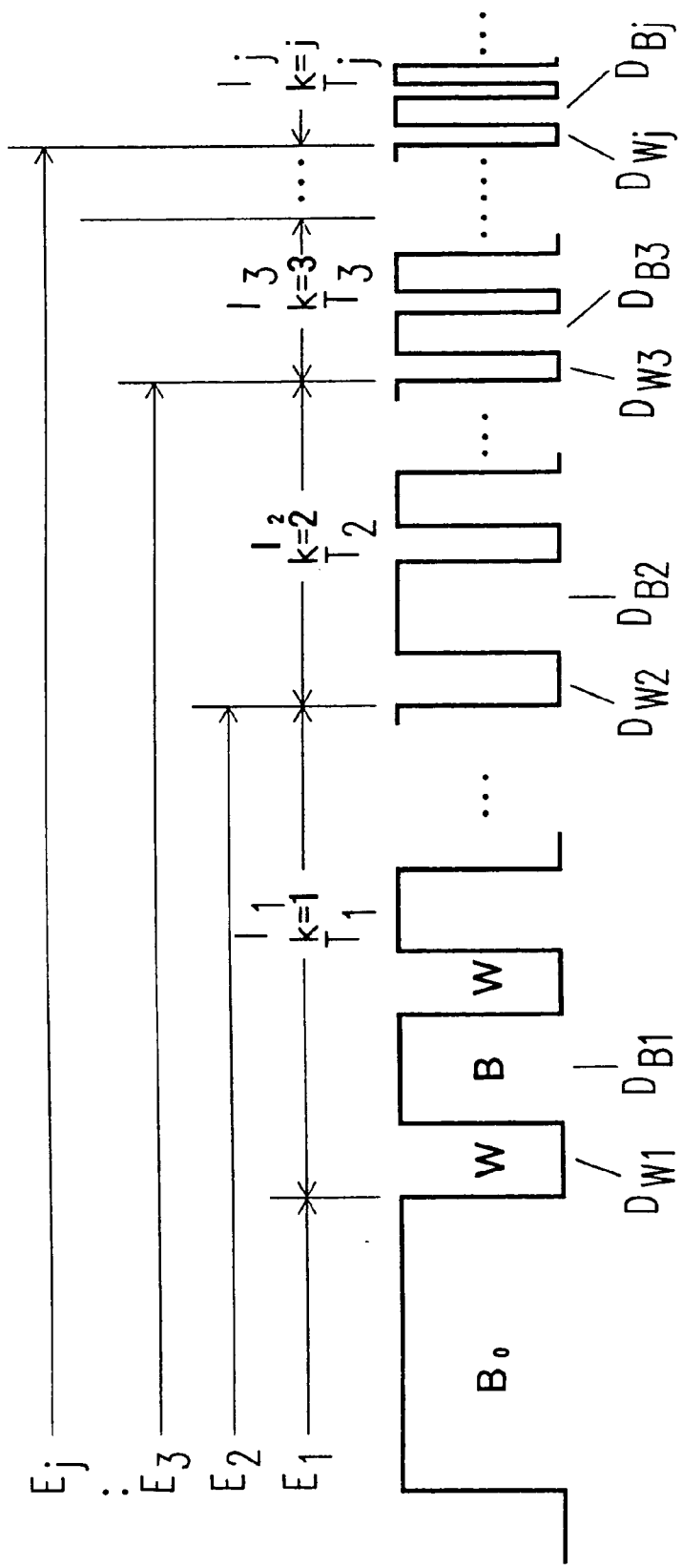
FIG. 3 is an explanatory view of partial quantum-wave interference layers $I_k$ according to the fourth aspect of the present invention.
Figure 8A:
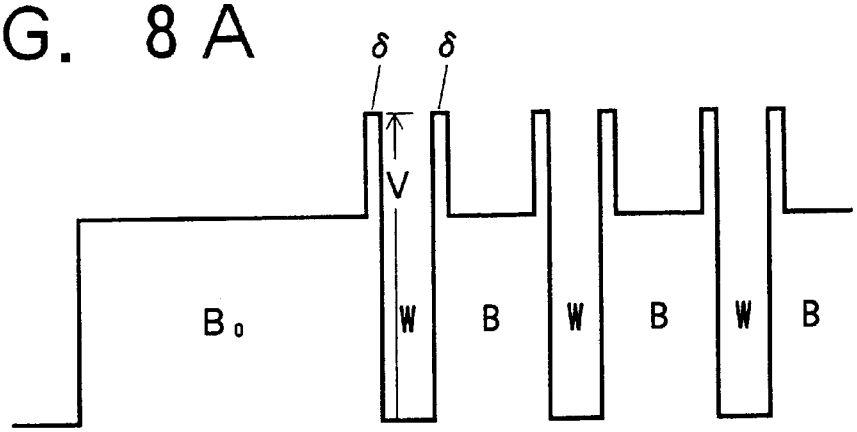
FIGS. 8A–8C are explanatory views of δ layers according to the second and the sixth aspects of the present invention.
Figure 8B:
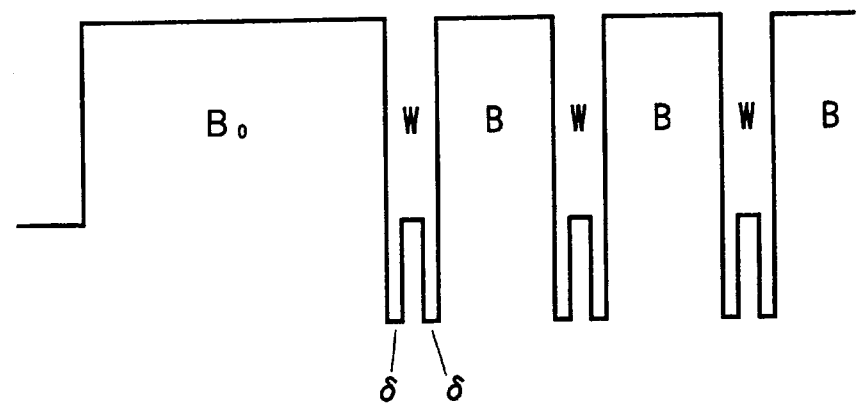
Figure 8C:
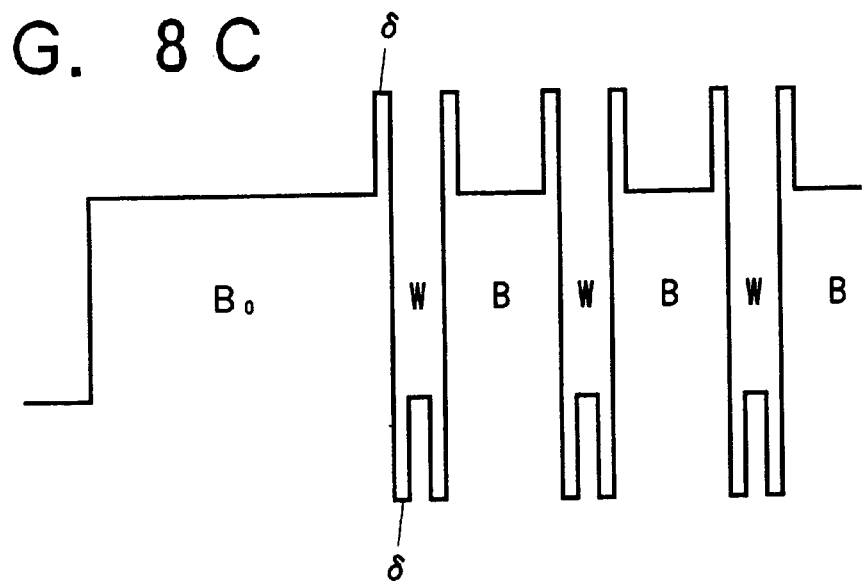
Figure 9:
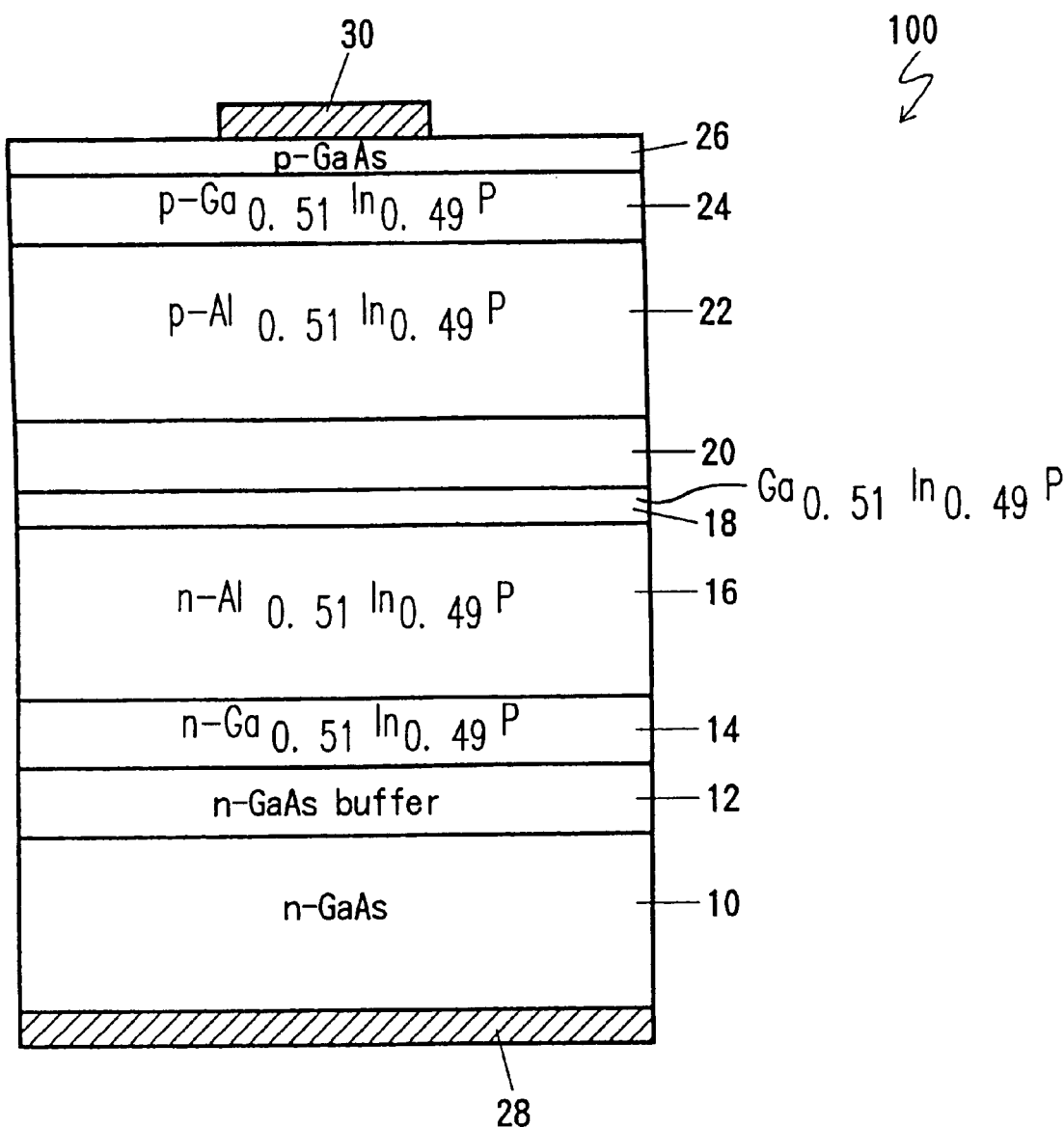
FIG. 9 is a sectional view showing a first exemplary structure of a light-emitting device (Example 1)

FIG. 9 is a sectional view of a light-emitting diode (LED) 100 in which a quantum-wave interference layer is formed in a p-type cladding layer. The p-type cladding layer of the LED 100 has a substrate 10 made of gallium arsenide (GaAs). A GaAs buffer layer 12 of n-type conduction, having a thickness generally of 0.3 μm and an electron concentration of $2 \times 10^{18}/cm^3$, is formed on the substrate 10. An n-$Ga_{0.51}In_{0.49}P$ contact layer 14 of n-type conduction, having a thickness generally of 0.3 μm and electron concentration of $2 \times 10^{18}/cm^3$, is formed on the buffer layer 12. An n-$Al_{0.51}In_{0.49}P$ cladding layer 16 of n-type conduction, having a thickness generally of 1.0 μm and an electron concentration of $1 \times 10^{18}/cm^3$, is formed on the contact layer 14. A non-doped $Ga_{0.51}In_{0.49}P$ emission layer 18, having a thickness generally of 14 nm, is formed on the cladding layer 16. An electron reflecting layer 20 functioning as a quantum-wave interference layer is formed on the emission layer 18. A p-$Al_{0.51}In_{0.49}P$ cladding layer 22 of p-type conduction, having a thickness generally of 1.0 μm and a hole concentration of $1 \times 10^{18}/cm^3$, is formed on the electron reflecting layer 20. A $Ga_{0.51}In_{0.49}P$ second contact layer 24 of p-type conduction, having a thickness generally of 0.2 μm and a hole concentration of $2 \times 10^{18}/cm^3$, is formed on the cladding layer 22. A p-GaAs first p-type contact layer of p-type conduction, having a thickness generally of 0.1 μm, is formed on the second contact layer 24. An electrode layer 28 made of gold and germanium (Au/Ge), having a thickness generally of 0.2 μm, is formed so as to cover the entire back of the substrate 10. Another electrode layer 30 made of gold and zinc (Au/Zn), having a thickness generally of 0.2 μm, is formed on some portion of the first contact layer 26. The substrate 10 has a diameter of 2.0 inch and the normal direction of its main surface is offset toward [011] axis by 15 degree from plane (100).

The LED 100 was manufactured by gas source molecular beam epitaxial deposition (GS-MBE), which is an epitaxial growth method performed under extremely a high vacuum condition. GS-MBE is different from a conventional MBE, which supplies group III and V elements both from the sources. In GS-MBE, group III elements such as indium (In), gallium (Ga), and aluminum (Al) are supplied from a solid source and group V elements such as arsenic (As) and phosphorus (P) are supplied by heat decomposition of gas material such as $AsH_3$ and $PH_3$.

Figure 10A:
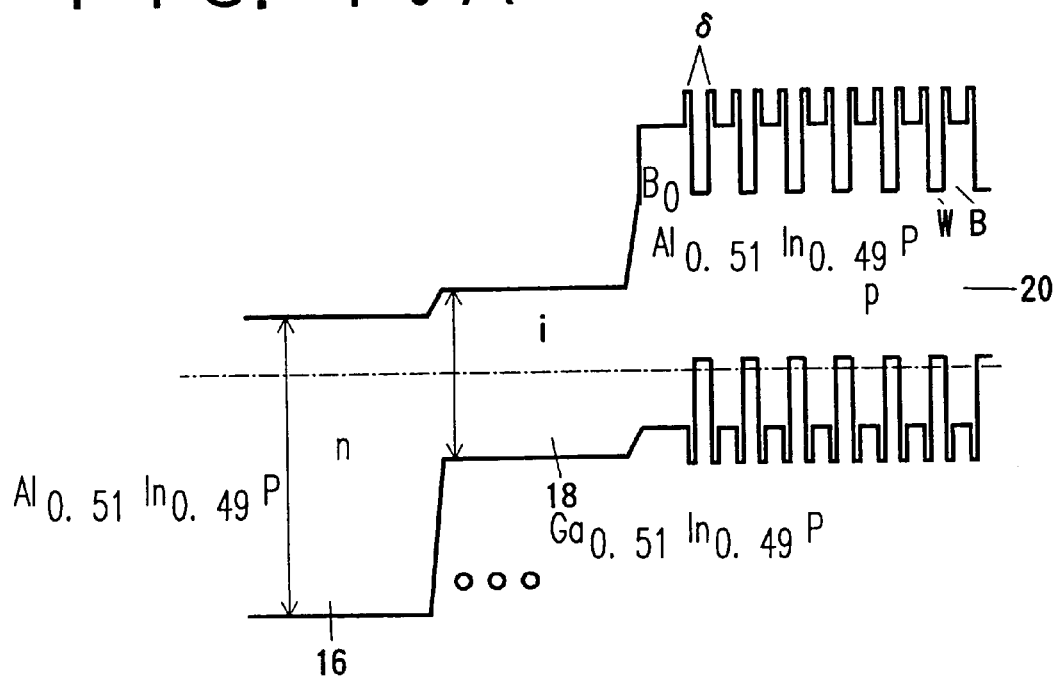
FIGS. 10A and 10B are views showing energy diagrams of the light-emitting device (Example 1 and 3)
Figure 10B:
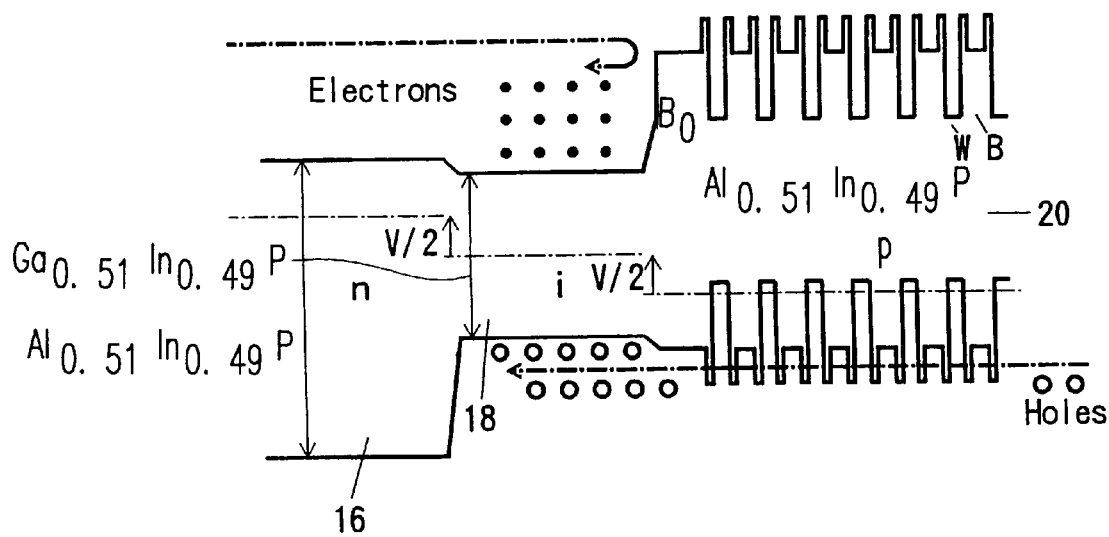

In the energy diagrams of FIGS. 10A and 10B, the n-type cladding layer 16, the emission layer 18, and the electron reflecting layer 20 are shown. FIG. 10A shows an energy level of conduction and valence bands on the condition that no external voltage is applied to the LED 100, and FIG. 10B shows the energy level on the condition that the external voltage is applied thereto. The electron reflecting layer 20, or a quantum-wave interference layer, has a multi-quantum layer structure with 15 periods of a p-$Ga_{0.51}In_{0.49}P$ well layer as a first layer W and a p-$Al_{0.51}In_{0.49}P$ barrier layer as a second layer B. A δ layer made of p-$Al_{0.33}Ga_{0.33}In_{0.33}P$ is formed at each interface between the first layer W and the second layer B. Thicknesses of the first layer W and the second layer B are respectively determined according to Eqs. 1 and 2. Only the first second layer $B_0$ is designed to have enough thickness to prevent conduction of carriers by tunneling effects. The δ layer is formed to have a thickness of 1.3 nm. Accordingly, electrons injected from the n-type cladding layer 16 into the emission layer 18 are reflected effectively by the electron reflecting layer 20 and confined into the emission layer 18. Although the valence band of the electron reflecting layer 20 also has a multiple period of energy level, holes are designed not to be reflected thereby. The respective thickness of the first layer W and the second layer B in the reflecting layer 20 is designed to reflect electrons only. Therefore, holes injected from the p-type cladding layer 22 pass through the electron reflecting layer 20 thus reaching the emission layer 18 easily and being confined therein by the cladding layer 16.

Figure 13:
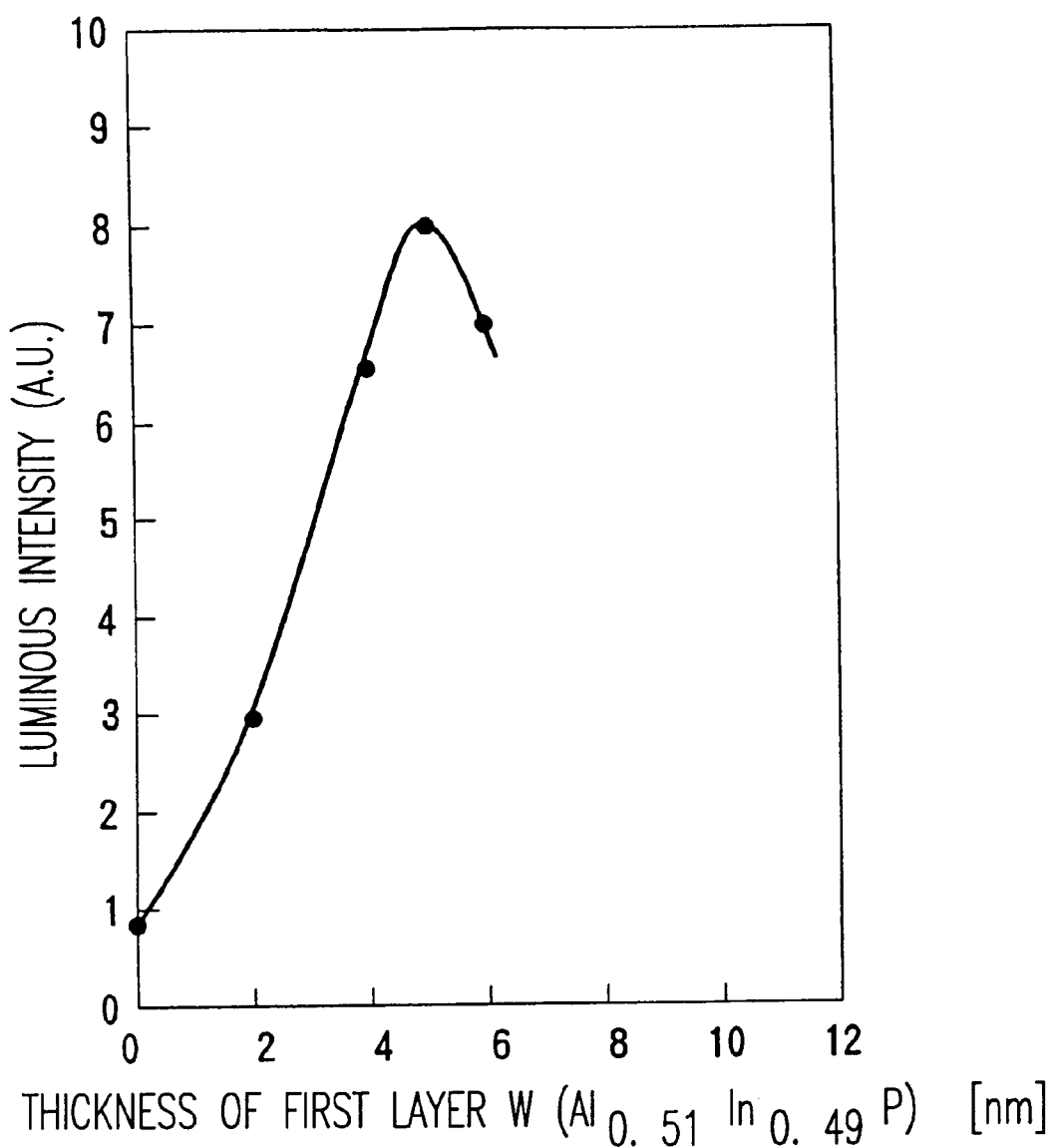
FIG. 13 is a graph showing a relationship between thickness of the first layer W and luminous intensity in Example 1.
Figure 14:
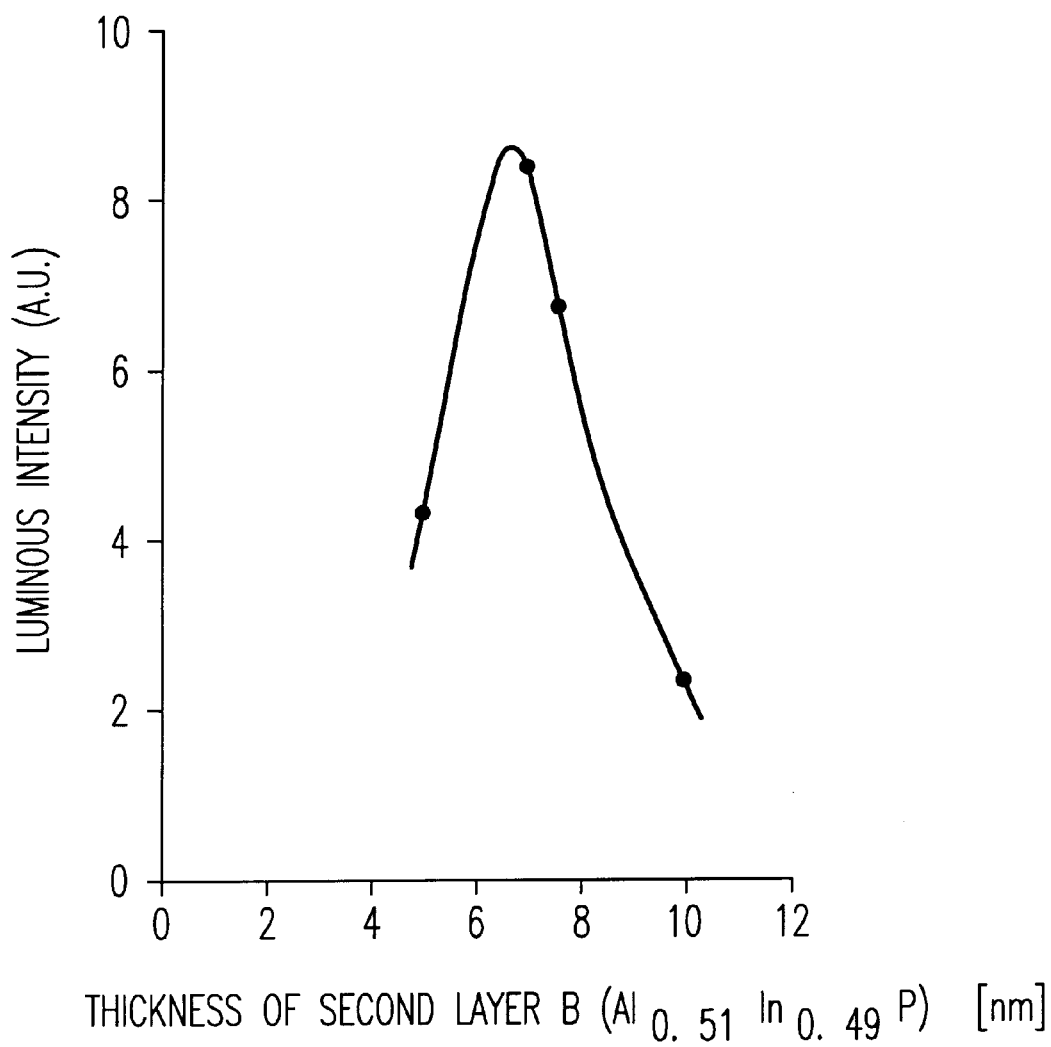
FIG. 14 is a graph showing the relationship between thickness of the second layer B and luminous intensity in Example 1.

Luminous intensity was measured by varying the respective thickness of the first layer W and the second layer B. FIG. 13 shows a result when the thickness of the second layer B was fixed at 7 nm and that of the first layer W was varied. As shown in FIG. 13, a peak of luminous intensity was obtained when the thickness of the first layer W was 5 nm. Then, luminous intensity was measured fixing the thickness of the first layer W at 5 nm and varying that of the second layer B, the result being shown in FIG. 14. When the second layer B has a thickness of 7 nm, luminous intensity showed its peak. As a result, the LED 100 with the electron reflecting layer 20 was found to have a maximum luminous intensity when the first layer W had a thickness of 5 nm and the second layer B had a thickness of 7 nm. The maximum luminous intensity was eightfold of that of a LED without the electron reflecting layer 20.

EXAMPLE 2

Figure 11:
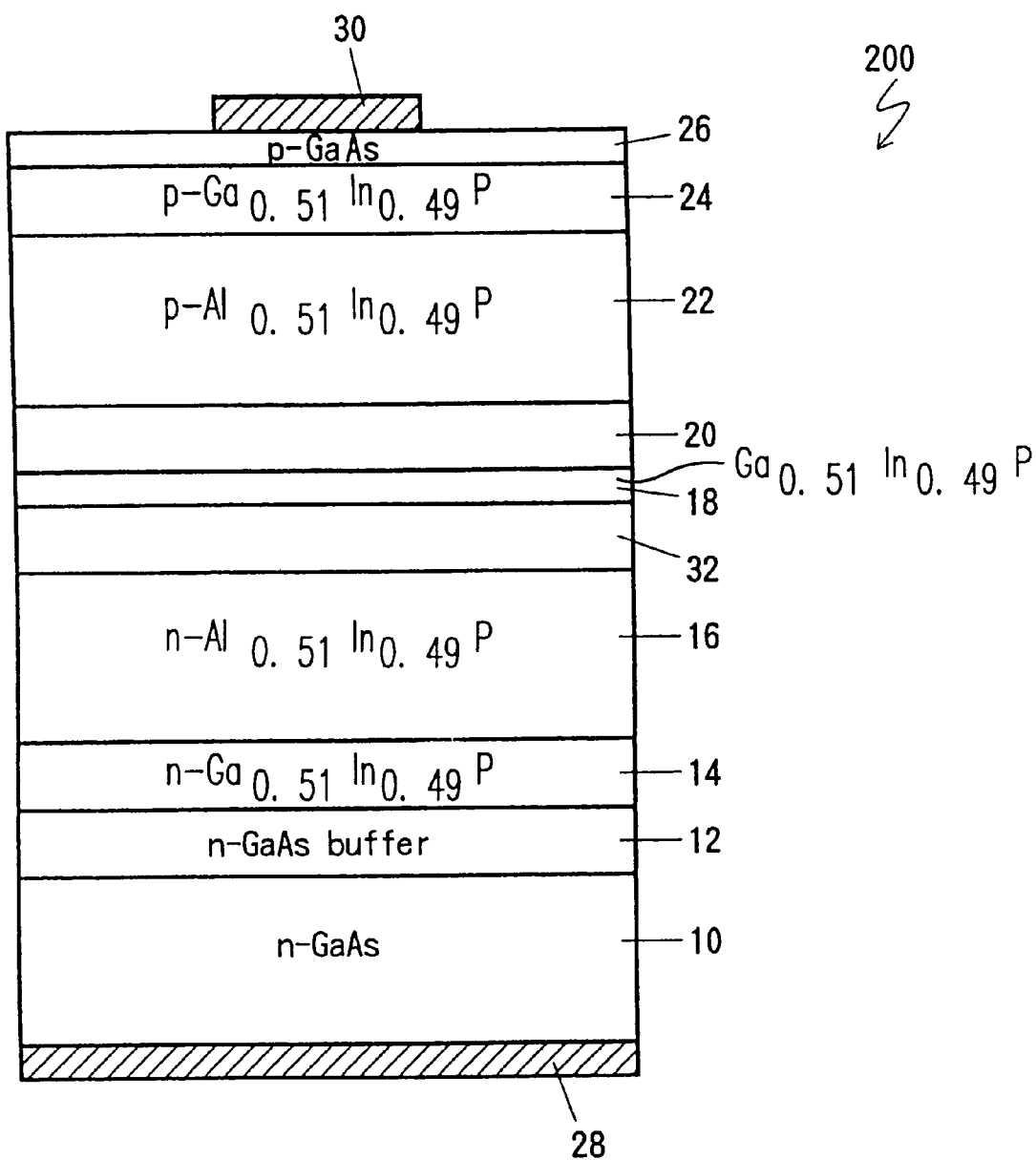
FIG. 11 is a sectional view showing a second exemplary structure of a light-emitting device (Example 2)

FIG. 11 shows an LED 200 used in the present embodiment. The LED 200 has a hole reflecting layer 32 additionally to the LED 100 structure for reflecting holes. The hole reflecting layer 32 is formed between the n-type cladding layer 16 and the emission layer 18 and has a same structure as the electron reflecting layer 20 of the LED 100. The thickness of the first layer W is 1.0 nm and that of the second layer B is 1.2 nm. FIG. 12A shows an energy level of conduction and valance bands on the condition that no external voltage is applied to the LED 200 and FIG. 12B shows a condition where the external voltage is applied thereto. As a result, the LED 200 thus obtained provides a luminous intensity of 16 fold compared with an LED with as same structure as the LED 200 but without the electron reflecting layer 20 and the hole reflecting layer 32.

EXAMPLE 3

Figure 15:
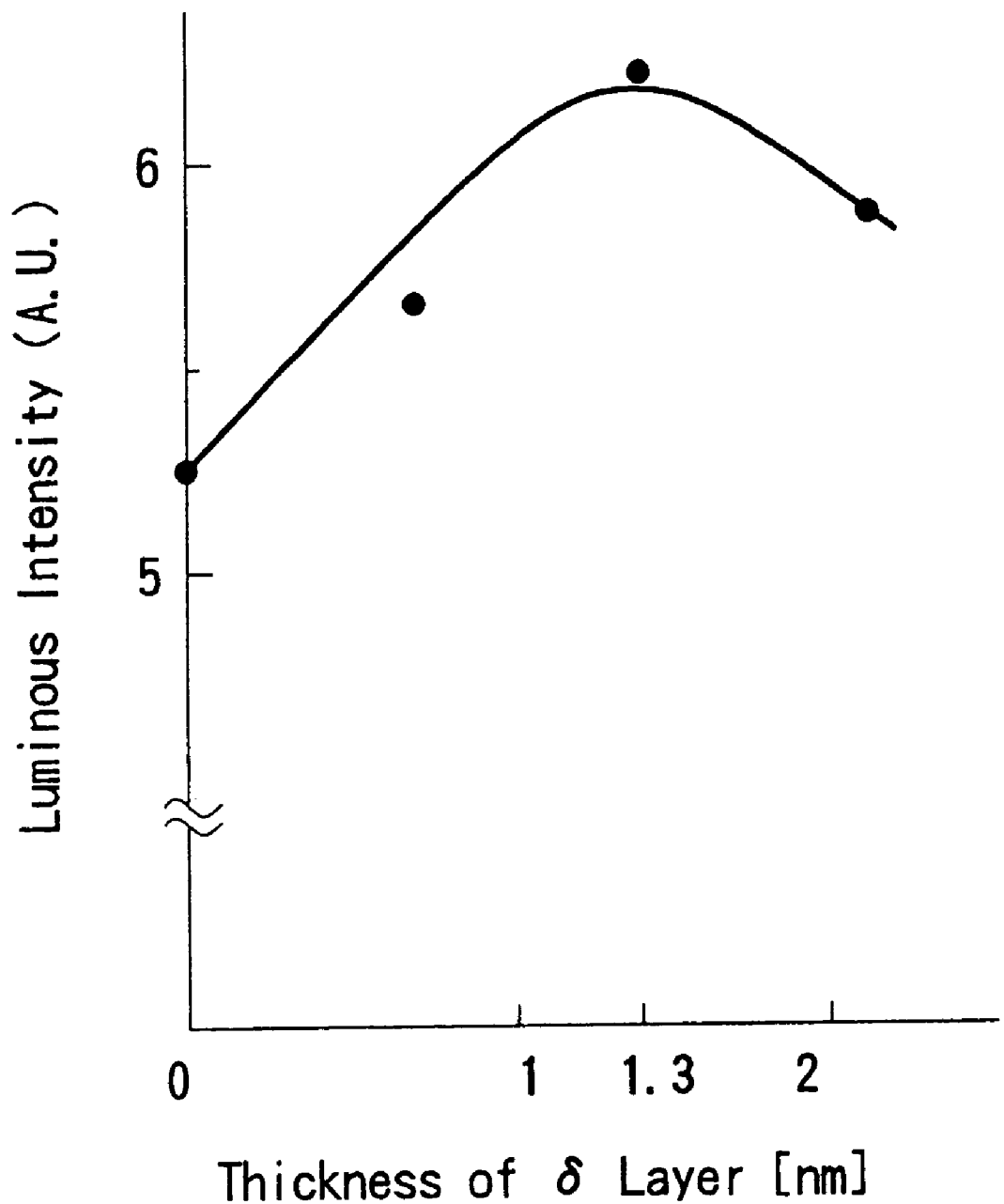
FIG. 15 is a graph showing the relationship between thickness of a δ layer and luminous intensity in Example 3.

In this embodiment, an LED has a structure as same as that of the LED 100 of FIG. 10A. A thickness of the δ layer is varied in many samples and a measured luminous intensity of the LED for the various thicknesses is shown in FIG. 15. The luminous intensity reaches its peak when the thickness of the δ layer is about 1.3 nm while the thicknesses of the first layer W and the second layer B are 5.6 nm and 7.5 nm, respectively, which slightly differed from the optimized thickness in Example 1. The obtained luminous intensity of the LED 300 was 1.5 fold of that of an LED without the δ layer.

EXAMPLE 4

Figure 16:
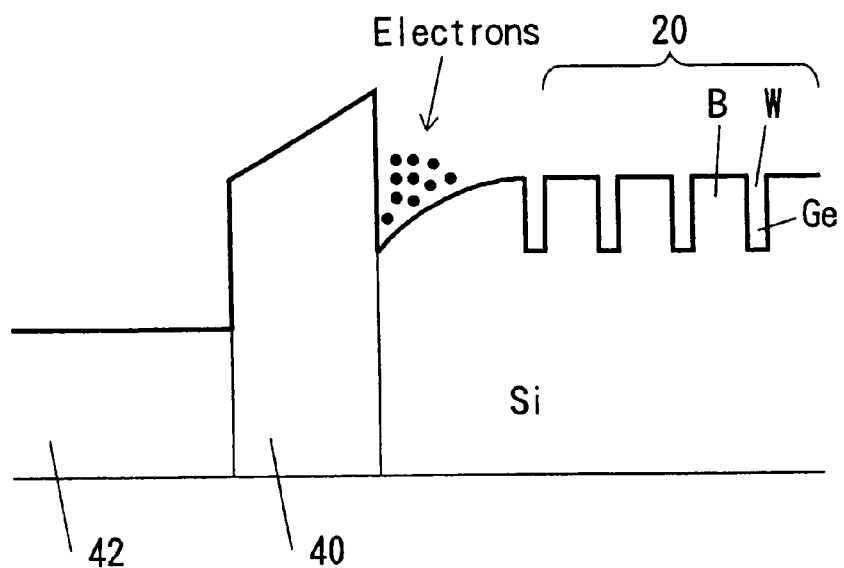
FIG. 16 is a view showing an energy diagram of the MOSFET in Example 4.

FIG. 16 is an energy diagram of a MOSFET according to the present embodiment. A conventional MOSFET has a channel of an inversion layer just beneath an insulation film 40, conducting minor carriers through the channel. A larger voltage is applied to a gate electrode 42 of the conventional MOSFET and thus more carriers in the channel of the inversion layer overflow. As a result, signal-to-noise (S/N) ratio decreases. In order to solve the problem, a quantum-wave interference layer 20 was formed below the channel as shown in FIG. 16 having a multi-layer structure with arbitrary periods including the second layer B made of silicon (Si) and the first layer W made of Ge. As a result, more carriers were confined in the channel of the inversion layer. In addition, S/N ratio was improved, response time was shortened, and driving voltage was lowered. When an n-type channel and electrons as a carrier were used, the most preferable thickness of the second layer B was 6.8 nm and that of the first layer W was 2.0 nm.

EXAMPLE 5

Figure 17:
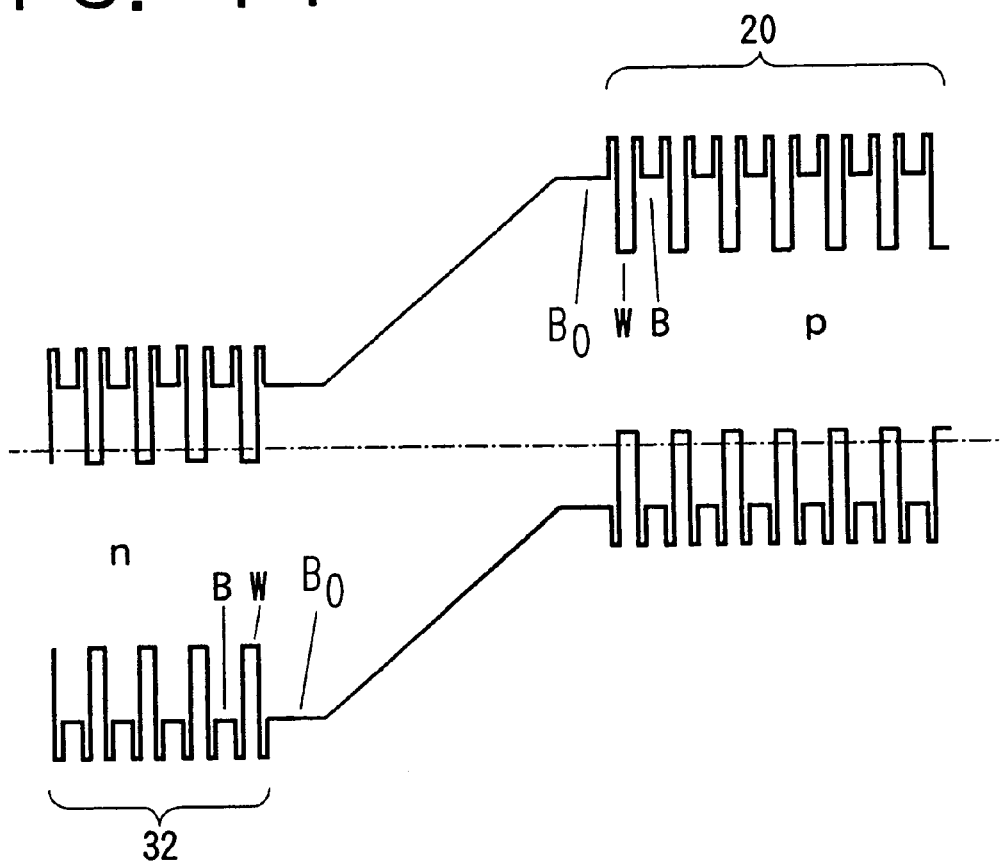
FIG. 17 is a view showing the energy diagram of the photovoltaic device in Example 5.

A quantum-wave interference layer can be formed in a photovoltaic device with a pn junction structure. As shown in FIG. 17, an electron reflecting layer 20 is formed in a p-layer, and a hole reflecting layer 32 is formed in an n-layer. When light is incided on the pn junction of a conventional device without the reflecting layers 20 and 32, pairs of an electron and a hole are formed. Most of the electrons in the conventional device are accelerated to the n-layer due to potential declination of conduction bands while the rest of the electrons drift to the p-layer so as not to contribute to induction of voltage. The larger the intensity of the incident light becomes, the more electrons overflow to the p-layer. Accordingly, the electron reflecting layer 20, or a quantum-wave interference layer, was formed in the p-layer in this embodiment. As a result, drifting of electrons were prevented, which enabled more electrons to conduct to the n-layer. Similarly, some of holes do not contribute to induction of voltage on account of holes drifting to the n-layer in a conventional element. Accordingly, in this embodiment the hole reflecting layer 32, or a quantum-wave interference layer, was formed in the n-layer. As a result, drifting of holes were prevented and enabled more holes to conduct to the p-layer. Consequently, leakage of current was minimized and efficiency of electro-optic conversion was improved.

In the present invention, embodiments of LEDs with quantum-wave interference layers are shown and discussed as Example 1–5. Alternatively, the quantum-wave interference layer can be applied to a laser diode. Further, in Example 1–5, the quantum-wave interference layer was formed to have a multi-layer structure made of ternary compounds including $Ga_{0.51}In_{0.49}P$ and $Al_{0.51}In_{0.49}P$. Alternatively, the interference layer can be made of quaternary compounds such as $Al_xGa_yIn_{1-x-y}P$, selecting arbitrary composition ratio within the range of $0 \leq x \leq 1$, $0 \leq y \leq 1$, and $0 \leq x+y \leq 1$. As another alternative, the quantum-wave interference layer can be made of group III-V compound semiconductor, group II-VI compound semiconductors, Si and Ge, and semiconductors of other hetero-material.

While the invention has been described in connection with what are presently considered to be the most practical and preferred embodiments, it is to be understood that the invention is not to be limited to the disclosed embodiments, but on the contrary, the description is intended to cover various modifications and equivalent arrangements included within the spirit and scope of the appended claims. The present document claims the benefit of Japanese priority document, filed in Japan on Apr. 25, 1997, the entire contents of which is incorporated herein by reference.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device comprising:
 a quantum-wave interference layer having plural periods of a pair of a first layer and a second layer, said second layer having a wider band gap than said first layer; and
 wherein the thickness of said first layer ($D_w$) is equal to:

$$D_w = n_w \lambda_w / 4,$$

where $n_w$ is an odd number and $\lambda_w$ is a quantum-wave wavelength of carriers in the first layer given by the equation:

$$\lambda_w = h / (2m_w(E+V))^{1/2},$$

where h is Plank's constant, $m_w$ is the effective mass of said carriers in said first layer, V is a difference in carrier potential energy between said second layer and said first layer, E is the kinetic energy of said carriers in said second layer without external voltage applied and $E \leq V/9$;

the thickness of said second layer ($D_B$) is equal to:

$$D_B = n_B \lambda_B / 4,$$

where $n_B$ is an odd number and $\lambda_B$ is a quantum-wave wavelength of carriers in the second layer given by the equation:

$$\lambda_B = h/(2m_B E)^{1/2},$$

where $m_B$ is the effective mass of said carriers in said second layer; and the carriers in said first and second layers are selected from the group consisting of electrons and holes.

2. A semiconductor device according to claim 1, wherein a δ layer is formed between said first and second layers for sharply varying energy band and has a thickness substantially thinner than said first and said second layers.

3. A semiconductor device according to claim 1, wherein said quantum-wave interference layer functions as a reflecting layer for reflecting said carriers.

4. A semiconductor device according to claim 1, further comprising a non-tunneling layer composed of the same material as said second layer, said non-tunneling layer being at an incident plane of quantum-wave in said quantum-wave interference layer having enough thickness to prevent conduction of carriers by a tunneling effect.

5. A light-emitting semiconductor device having a quantum-wave interference layer of claim 1 and further comprising:
   an n-type layer;
   a p-type layer;
   an active layer formed between said n-type layer and said p-type layer; and
   wherein one of said n-type layer and said p-type layer is said quantum-wave interference layer.

6. A light-emitting semiconductor device according to claim 5, wherein said n-layer and/or said p-layer form a hetero-junction to said active layer respectively functioning as an n-type cladding layer and a p-type cladding layer and said carriers are confined into said active layer by being reflected by said quantum-wave interference layer.

7. A field effect transistor comprising a quantum-wave interference layer of claim 1 formed adjacent to a channel.

8. A photovoltaic device having a pn junction including an n-layer and a p-layer comprising at least one of said n-layer and said p-layer being made of a quantum-wave interference layer of claim 1 for reflecting minority carriers as a reflecting layer.

9. A semiconductor device comprising:
   a quantum-wave interference layer having plural periods of a pair of a first layer and a second layer, said second layer having a wider band gap than said first layer;
   a δ layer for sharply varying an energy band, being formed between each first and second layers; and
   wherein the thickness of said first layer ($D_W$) is equal to:

$$D_W = n_W \lambda_W / 4,$$

where $n_W$ is an odd number and $\lambda_W$ is a quantum-wave wavelength of carriers injected in the first layer given by the equation:

$$\lambda_W = h/(2m_W(E+V))^{1/2},$$

where h is Plank's constant, $m_W$ is the effective mass of said carriers injected in said first layer, V is a difference in carrier potential energy between said second layer and said first layer, E is the kinetic energy of said carriers injected in said second layer without external voltage applied and $E \leq V/9$;

the thickness of said second layer ($D_B$) is equal to:

$$D_B = n_B \lambda_B / 4,$$

where $n_B$ is an odd number and $\lambda_B$ is a quantum-wave wavelength of carriers injected in the second layer given by the equation:

$$\lambda_B = h/(2m_B E)^{1/2},$$

where $m_B$ is the effective mass of said carriers injected in said second layer; and the carriers in said first and second layers are selected from the group consisting of electrons and holes.

10. A semiconductor device according to claim 9, wherein said quantum-wave interference layer functions as a reflecting layer for reflecting said carriers.

11. A semiconductor device according to claim 9, further comprising a non-tunneling layer composed of the same material as said second layer, said non-tunneling layer being at an incident plane of quantum-wave in said quantum-wave interference layer having enough thickness to prevent conduction of carriers by a tunneling effect.

12. A light-emitting semiconductor device having a quantum-wave interference layer of claim 9 and further comprising:
   an n-type layer;
   a p-type layer;
   an active layer formed between said n-type layer and said p-type layer; and
   wherein one of said n-type layer and said p-type layer is said quantum-wave interference layer.

13. A light-emitting semiconductor device according to claim 12, wherein said n-layer and/or said p-layer form a hetero-junction to said active layer respectively functioning as an n-type cladding layer and a p-type cladding layer and said carriers are confined into said active layer by being reflected by said quantum-wave interference layer.

14. A field effect transistor comprising a quantum-wave interference layer of claim 9 formed adjacent to a channel.

15. A photovoltaic device having a pn junction including an n-layer and a p-layer comprising at least one of said n-layer and said p-layer being made of a quantum-wave interference layer of claim 9 for reflecting minority carriers as a reflecting layer.

* * * * *